(12) United States Patent
Tsai et al.

(10) Patent No.: US 10,847,552 B2
(45) Date of Patent: Nov. 24, 2020

(54) ELECTRONIC MODULATING DEVICE

(71) Applicant: InnoLux Corporation, Miao-Li County (TW)

(72) Inventors: Tsung-Han Tsai, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 45 days.

(21) Appl. No.: 16/161,375

(22) Filed: Oct. 16, 2018

(65) Prior Publication Data

US 2020/0119056 A1   Apr. 16, 2020

(51) Int. Cl.
*H01L 27/12*       (2006.01)
*G02F 1/1339*    (2006.01)

(52) U.S. Cl.
CPC ........ *H01L 27/1251* (2013.01); *H01L 27/124* (2013.01); *G02F 1/13394* (2013.01)

(58) Field of Classification Search
CPC .......................... H01L 27/1251; H01L 27/124
See application file for complete search history.

(56) References Cited

U.S. PATENT DOCUMENTS

| | | |
|---|---|---|
| 5,694,188 A | 12/1997 | Sano et al. |
| 2013/0256669 A1 | 10/2013 | Jang et al. |
| 2016/0096725 A1* | 4/2016 | Umezaki ............... B81B 3/0086 257/72 |
| 2016/0197098 A1* | 7/2016 | Xian .................... H01L 27/1222 257/72 |
| 2016/0261042 A1 | 9/2016 | Sazegar et al. |
| 2018/0337446 A1* | 11/2018 | Nakazawa .......... H01L 27/1259 |
| 2019/0244975 A1* | 8/2019 | He ..................... G02F 1/133345 |

FOREIGN PATENT DOCUMENTS

WO    2017/130489 A1    8/2017

OTHER PUBLICATIONS

Extended European Search Report dated Jan. 24, 2020, issued in application No. EP 19202270.5.

* cited by examiner

*Primary Examiner* — Kyoung Lee
*Assistant Examiner* — Christina A Sylvia
(74) *Attorney, Agent, or Firm* — McClure, Qualey & Rodack, LLP

(57) ABSTRACT

An electronic modulating device is provided. The electronic modulating device includes a first modulating unit. The first modulating unit includes a first transistor including a channel arranged in an extending direction. The first modulating unit also includes a first modulating electrode electrically connected to the first transistor and arranged in a first longitudinal direction. The electronic modulating device also includes a second modulating unit. The second modulating unit includes a second transistor including a channel arranged in the extending direction. The second modulating unit also includes a second modulating electrode electrically connected to the second transistor and arranged in a second longitudinal direction that is different from the first longitudinal direction. The first included angle between the extending direction and the first longitudinal direction is different from a second included angle between the extending direction and the second longitudinal direction.

20 Claims, 16 Drawing Sheets

ELECTRONIC MODULATING DEVICE

BACKGROUND

Technical Field

The present disclosure relates to an electronic modulating device, and in particular to an electronic modulating device that includes different arrangements of modulating electrodes.

Description of the Related Art

Electronic products that include a display panel, such as smartphones, tablets, notebooks, monitors, and TVs, have become indispensable necessities in modern society. With the flourishing development of such portable electronic products, consumers have high expectations regarding the quality, functionality, and price of such products. These electronic products are often provided with communications capabilities. However, the communications capabilities still need to be improved.

SUMMARY

In accordance with some embodiments of the present disclosure, an electronic modulating device is provided. The electronic modulating device includes a first modulating unit. The first modulating unit includes a first transistor including a channel arranged in an extending direction. The first modulating unit also includes a first modulating electrode electrically connected to the first transistor and arranged in a first longitudinal direction. The electronic modulating device also includes a second modulating unit. The second modulating unit includes a second transistor including a channel arranged in the extending direction. The second modulating unit also includes a second modulating electrode electrically connected to the second transistor and arranged in a second longitudinal direction that is different from the first longitudinal direction. The first included angle between the extending direction and the first longitudinal direction is different from a second included angle between the extending direction and the second longitudinal direction.

In accordance with some embodiments of the present disclosure, an electronic modulating device is provided. The electronic modulating device includes a first modulating unit. The first modulating unit includes a first transistor including a channel. The first modulating unit also includes a first modulating electrode electrically connected to the first transistor. The electronic modulating device also includes a second modulating unit. The second modulating unit includes a second transistor including a channel. The second modulating unit also includes a second modulating electrode electrically connected to the second transistor. A distance between the channel of the first transistor and the first modulating electrode is different from a distance between the channel of the second transistor and the second modulating electrode A detailed description is given in the following embodiments with reference to the accompanying drawings.

BRIEF DESCRIPTION OF THE DRAWINGS

The disclosure may be understood by reading the subsequent detailed description and examples with references made to the accompanying drawings, wherein.

DETAILED DESCRIPTION

Figure 1:
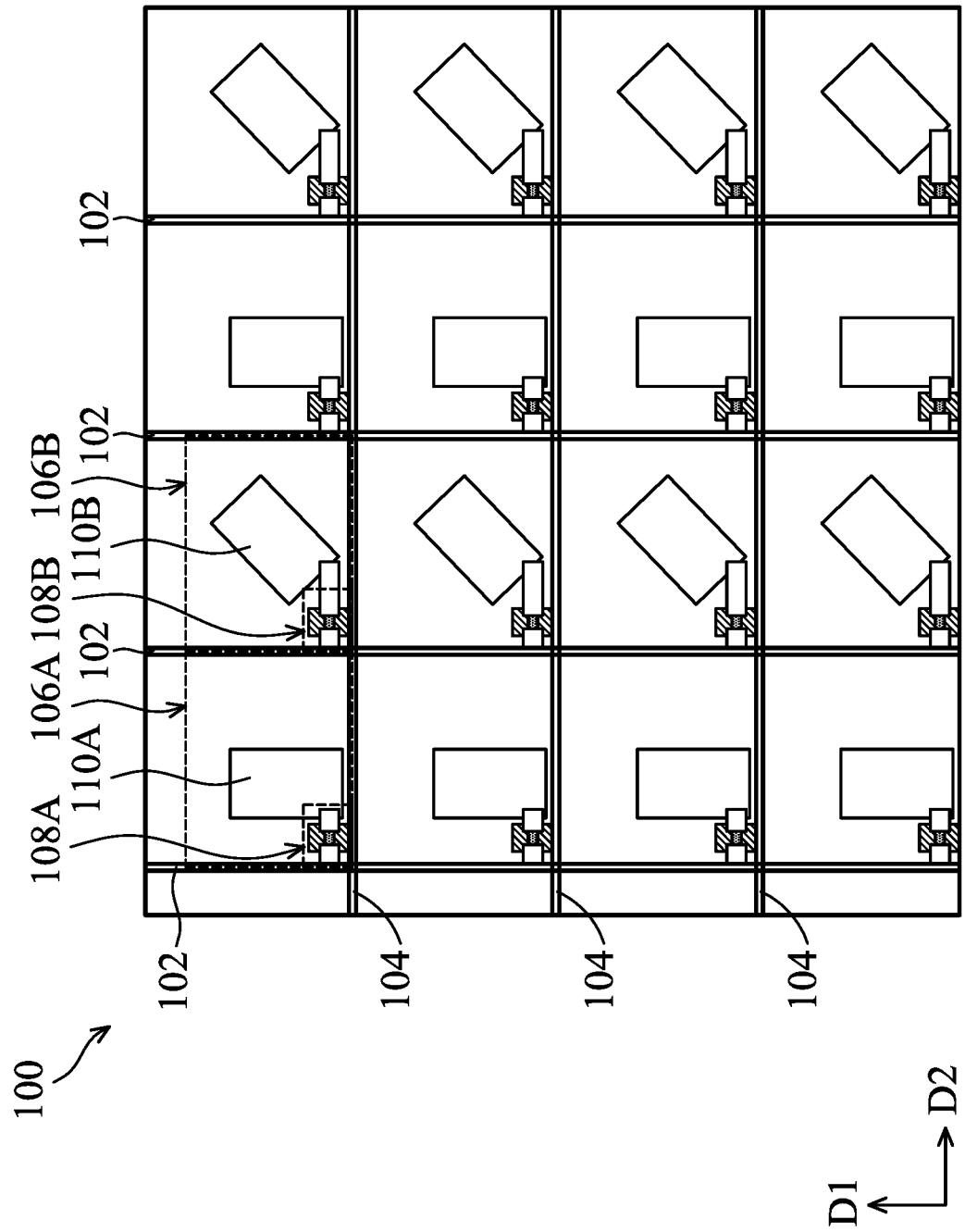
FIG. 1 illustrates a top view of the electronic modulating device in accordance with some embodiments of the present disclosure.

The electronic modulating device of the present disclosure and the manufacturing method thereof are described in detail in the following description. In the following detailed description, for purposes of explanation, numerous specific details and embodiments are set forth in order to provide a thorough understanding of the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements. However, the use of like and/or corresponding numerals in the drawings of different embodiments does not suggest any correlation between different embodiments. In addition, in this specification, expressions such as "first material layer disposed above/on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "upper" or "lower" is used to describe the position of one element relative to another. It should be appreciated that if a device is flipped upside down, an element that is on the "bottom" will become an element that is on the "top".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "about" and "substantially" typically mean+/− 20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially". Moreover, when considering the deviation or the fluctuation of the manufacturing process, the term "same" may also include the meaning of "about" or "substantially"

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In addition, the term "longitudinal direction" is defined as the direction along or parallel to the long axis of an object. The long axis is defined as a line extending through the center of an object lengthwise. For an elongated or oblong object, the long axis corresponds most nearly to its greatest dimension lengthwise. For an object that does not have a definite long axis, the long axis is the long axis of the smallest rectangle that can encompass the object.

In addition, the phrase "in a range from a first value to a second value" indicates the range includes the first value, the second value, and other values in between.

In accordance with some embodiments of the present disclosure, an electronic modulating device is provided. The electronic modulating device has electronic units that have different included angles between the extending direction of the channel of the transistor and the longitudinal direction of the modulating electrode. Thus, there are fewer variations of the information received at different directions from the electronic modulating device.

FIG. 1 illustrates a top view of an electronic modulating device 100 in accordance with some embodiments of the present disclosure. It should be understood that some of the components of the electronic modulating device 100 are omitted in FIG. 1 for clarity. It also should be understood that additional components may be added to the electronic modulating device 100 in accordance with some embodiments of the present disclosure. Some of the components described below may be replaced or eliminated in accordance with some embodiments of the present disclosure.

As illustrated in FIG. 1, the electronic modulating device 100 includes a plurality of data lines 102 and scan lines 104. At least one of the data lines 102 may extend along a first direction D1 (e.g. the Y-direction), and at least one of the scan lines 104 may extend along a second direction D2 (e.g. the X-direction) different from the first direction D1. The data lines 102 and the scan lines 104 may define a plurality of modulating units or pixels. In some embodiments, the electronic modulating device 100 includes a plurality of modulating units 106A and modulating units 106B that are electrically connected to the data lines 102 and the scan lines 104, respectively. For example, the source electrodes of some of the modulating units 106A and the modulating units 106B may be electrically connected to the data lines 102. For another example, the gate electrodes of some of the modulating units 106A and the modulating units 106B may be electrically connected to the scan lines 104. In addition, the modulating units 106A and/or the modulating units 106B may be both arranged along the first direction D1. Many variations and/or modifications can be made to embodiments of the disclosure. In some embodiments, modulating units 106A and/or modulating units 106B may be both arranged along the second direction D2.

As shown in FIG. 1, at least one of the modulating units 106A includes a transistor 108A and a modulating electrode 110A, and at least one of the modulating units 106B includes a transistor 108B and a modulating electrode 110B. In some embodiments, the orientation of the modulating medium (such as liquid crystals) of the electronic modulating device 100 can be controlled by adjusting the capacitance between the modulating electrode (110A and 110B) and a common electrode (shown in FIG. 8) so that the electro-magnetic radiation (e.g. light) having a different wavelength can be emitted from and/or received by the electronic modulating device 100.

Figure 2A:
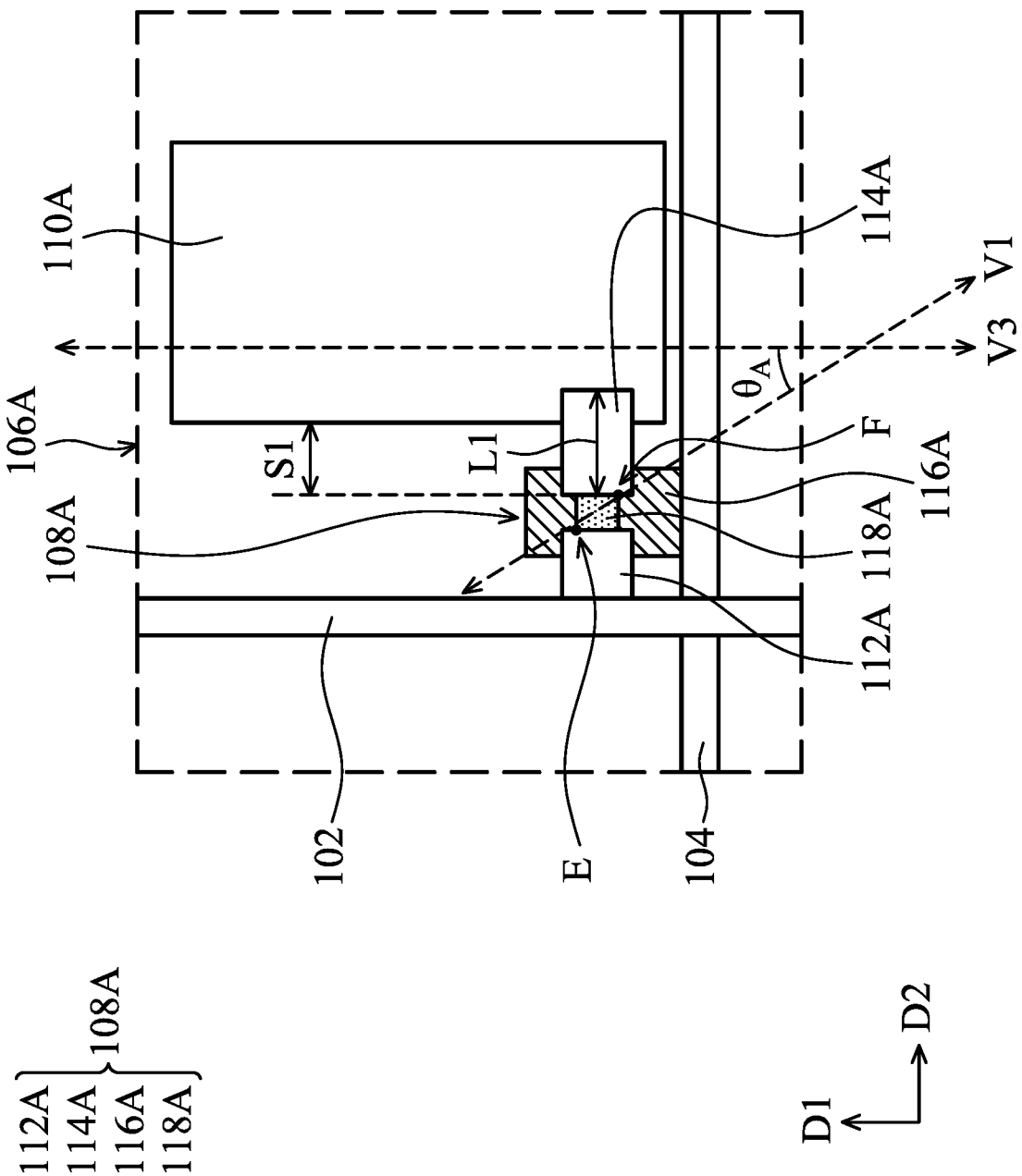
FIGS. 2A and 2B illustrate enlarged top views of a modulating unit in the electronic modulating device in accordance with some embodiments of the present disclosure.
Figure 2B:
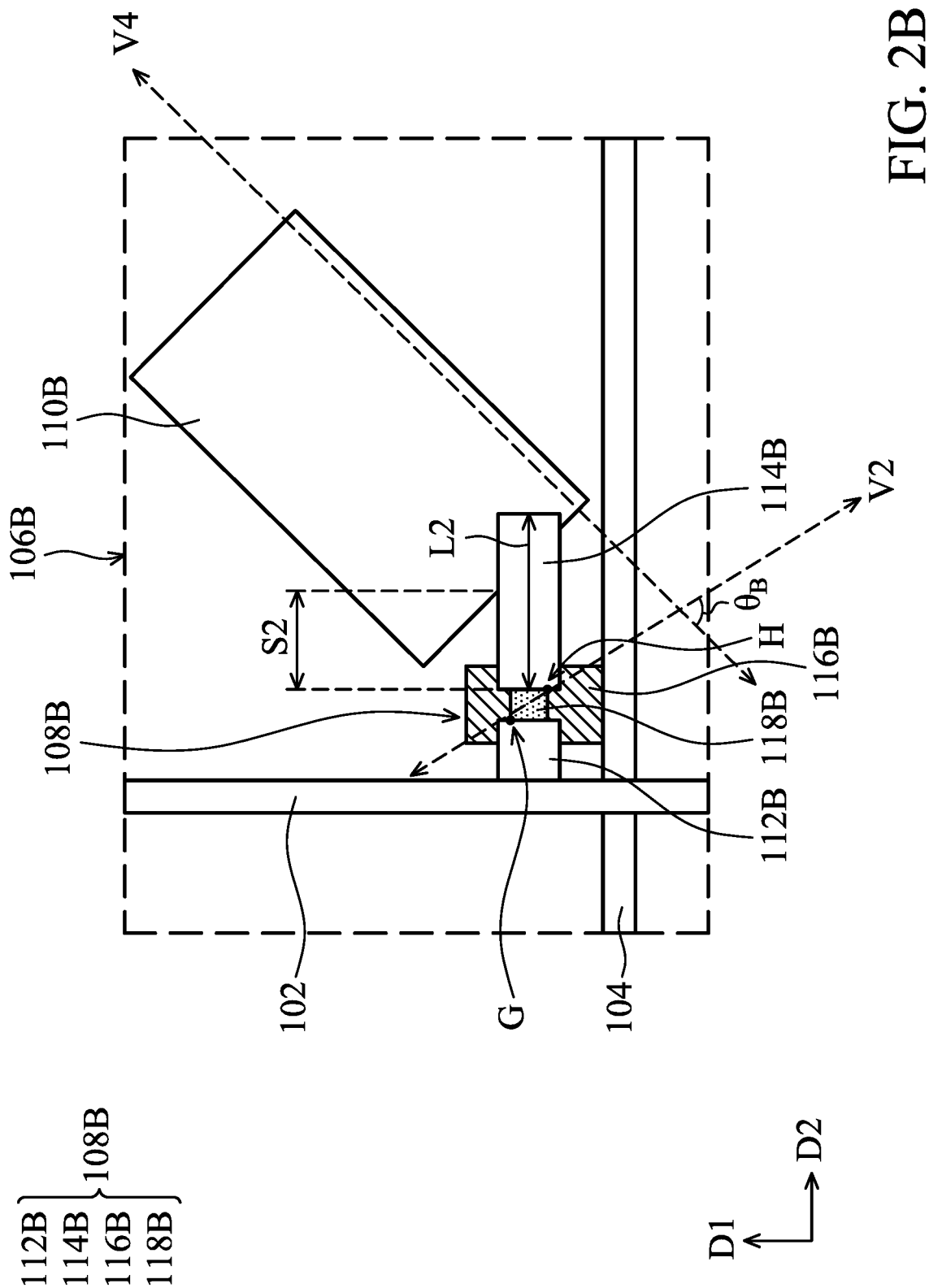

Refer to FIGS. 2A and 2B, which illustrate enlarged top views of the modulating unit 106A and the modulating unit 106B in accordance with some embodiments of the present disclosure. As shown in FIG. 2A, the transistor 108A includes a source electrode 112A, a drain electrode 114A, a gate electrode 116A and a channel 118A. The source electrode 112A and the drain electrode 114A may be disposed on two opposite sides of the gate electrode 116A. The channel 118A may be formed between the source electrode 112A and the drain electrode 114A. Moreover, the drain electrode 114A may be electrically connected to the modulating electrode 110A.

As shown in FIG. 2B, the transistor 108B includes a source electrode 112B, a drain electrode 114B, a gate electrode 116B and a channel 118B. The source electrode 112B and the drain electrode 114B are disposed on two opposite sides of the gate electrode 116B. The channel 118B may be formed between the source electrode 112B and the drain electrode 114B. Moreover, the drain electrode 114B may be electrically connected to the modulating electrode 110B. The source electrode 112B, the gate electrode 116B and the channel 118B of the modulating unit 106B may respectively be the same as or similar to the source electrode 112A, the gate electrode 116A and the channel 118A of the modulating unit 106A.

In some embodiments, one of the differences between the modulating unit 106A and the modulating unit 106B is that the included angles between the extending direction of the channel and the longitudinal direction of the modulating electrode. In some embodiments, as shown in FIGS. 2A and 2B, direction V1 and direction V2 can respectively be regarded as the extending directions of channel 118A and channel 118B. Moreover, the direction V1 of channel 118A and the direction V2 of channel 118B may be substantially parallel. The extending direction of the channel may be a direction determined by two reference points respectively on the drain electrode and the source electrode. The two reference points may be overlapped with the channel.

For example, as shown in FIG. 2A, the direction V1 of channel 118A may be determined by reference point E on the source electrode 112A and reference point F on the drain electrode 114A. Similarly, the direction V2 of channel 118B may be determined by a reference point G on the source electrode 112B and a reference point H on the drain electrode 114B. More specifically, the positions of the reference points E and F of the modulating unit 106A may correspond to the reference points G and H of the modulating unit 106B so that direction V1 may be substantially parallel to direction V2.

In some embodiments, the modulating electrode 110A may have a rectangular shape. The longitudinal direction of the modulating electrode 110A may be substantially parallel to the long side of the modulating electrode 110A. Similarly, the longitudinal direction of the modulating electrode 110B may be substantially parallel to the long side of the modulating electrode 110B. In this embodiment, direction V3, which may be substantially parallel to the long side of the modulating electrode 110A, may be the longitudinal direction of modulating electrode 110A. Direction V4, which may be substantially parallel to the long side of the modulating electrode 110B, may be the longitudinal direction of modulating electrode 110B. As shown in FIGS. 2A and 2B, the longitudinal direction of modulating electrode 110B (direction V4) may be different from the longitudinal direction of modulating electrode 110A (direction V3).

In some embodiments, as shown in FIGS. 2A and 2B, the first included angle $\theta_A$ between the direction V1 and the direction V3 is different from a second included angle $\theta_B$ between the direction V2 and the direction V4. That is, the included angle between the extending direction of the transistor 108A and the longitudinal direction of the modulating electrode 110A of the modulating unit 106A may be different from the included angle between the extending direction of the transistor 108B and the longitudinal direction of the modulating electrode 110B of the modulating unit 106B. Because the longitudinal direction of the modulating electrode influences on the orientation of the modulating medium, the orientation of the modulating medium of the modulating unit 106A may be different from the orientation of the modulating medium of the modulating unit 106B. That is, the orientation of the modulating medium may vary in accordance with the included angles of the modulating unit. Moreover, the direction V1 may be parallel to the direction V2 so that the variance of the lithography and/or etching process for forming the components of the modulating unit 106A and the modulating unit 106B may be reduced. Furthermore, the difference between the width-to-length ratios of the channel 118A and the channel 118B may also be reduced.

In some embodiments, the difference between the first included angle $\theta_A$ and the second included angle $\theta_B$ may be greater than 15 degrees. For example, the difference between the first included angle $\theta_A$ and the second included angle $\theta_B$ may be in a range from 15 degrees to 90 degrees, such as 30 degrees or 60 degrees. In some embodiments, the difference between the first included angle $\theta_A$ and the second included angle $\theta_B$ may be in a range from 45 degrees to 90 degrees. In some cases, the difference between the first included angle $\theta_A$ and the second included angle $\theta_B$ may not be less than 15 degrees. If the difference between the first included angle $\theta_A$ and the second included angle $\theta_B$ is less than 15 degrees, the information emitted by the electronic device may be affected when the receiver is located in an undesired location. It is noted that the included angles of the extending direction of the channel and the longitudinal direction of modulating electrode may include an acute angle and an obtuse angle. The first included angle $\theta_A$ and the second included angle $\theta_B$ may be referred to the acute angle. But the present disclosure is not limited thereto.

In some embodiments, as shown in FIGS. 2A and 2B, the length L1 of the drain electrode 114A may be different from the length L2 of the drain electrode 114B due to different extending directions of the modulating electrode 110A and the modulating electrode 110B. The lengths L1 and L2 may be measured along the second direction D2 (e.g. the X-direction). In some embodiments, the distance S1 between the channel 118A and the modulating electrode 110A may be different from the distance S2 between the channel 118B and the modulating electrode 110B. The distances S1 and S2 may be measured along the second direction (e.g. the X-direction). It should be understood that the distances S1 and S2 can be defined as a minimum distance between the channel and the modulating electrode, and the distances S1 and S2 are not limited to be measured along the second direction D2 but measured along the same direction.

Figure 3A:
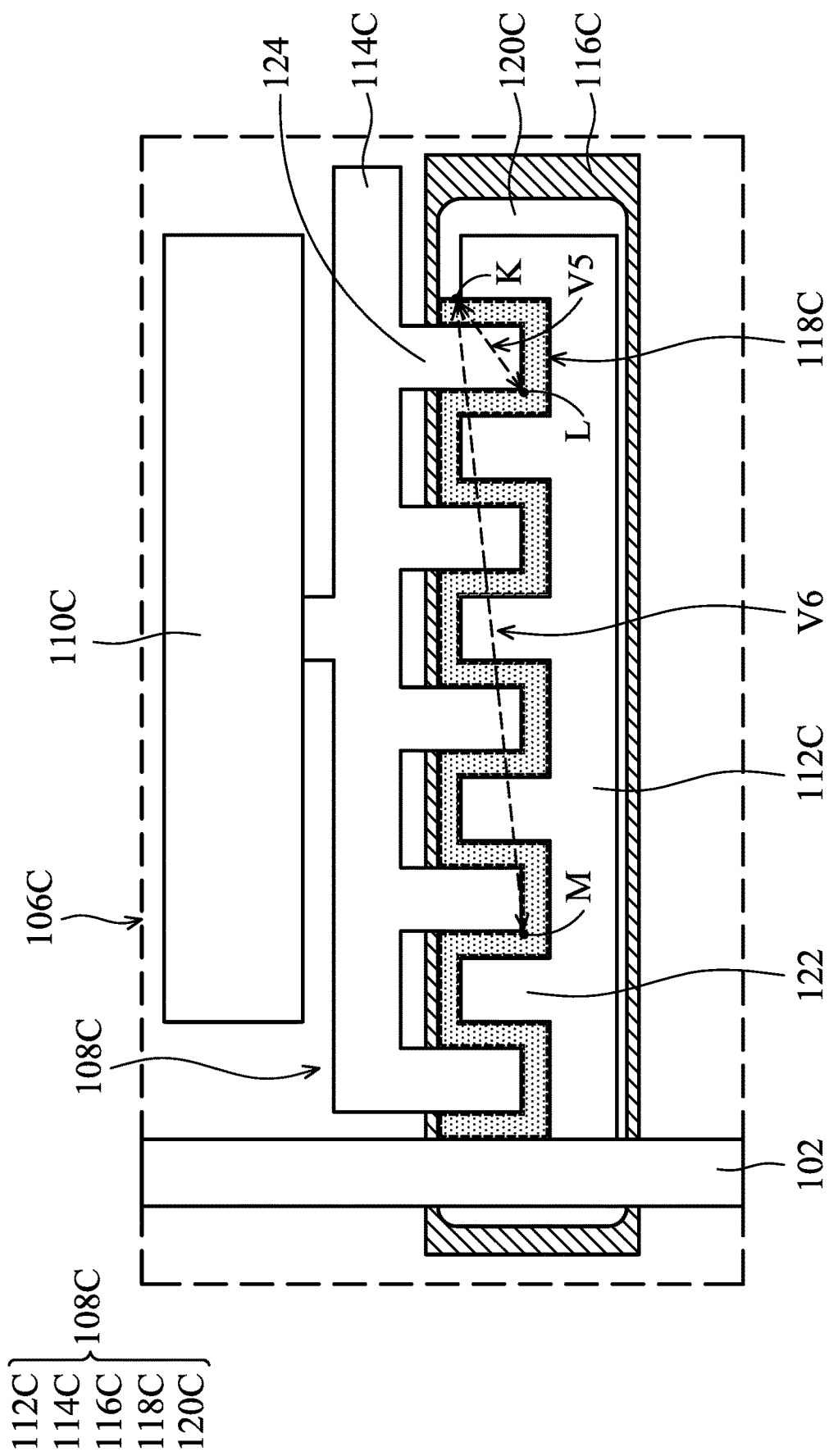
FIGS. 3A and 3B illustrate examples of the definition of the extending direction of a channel in the electronic modulating device in accordance with some embodiments of the present disclosure.
Figure 3B:
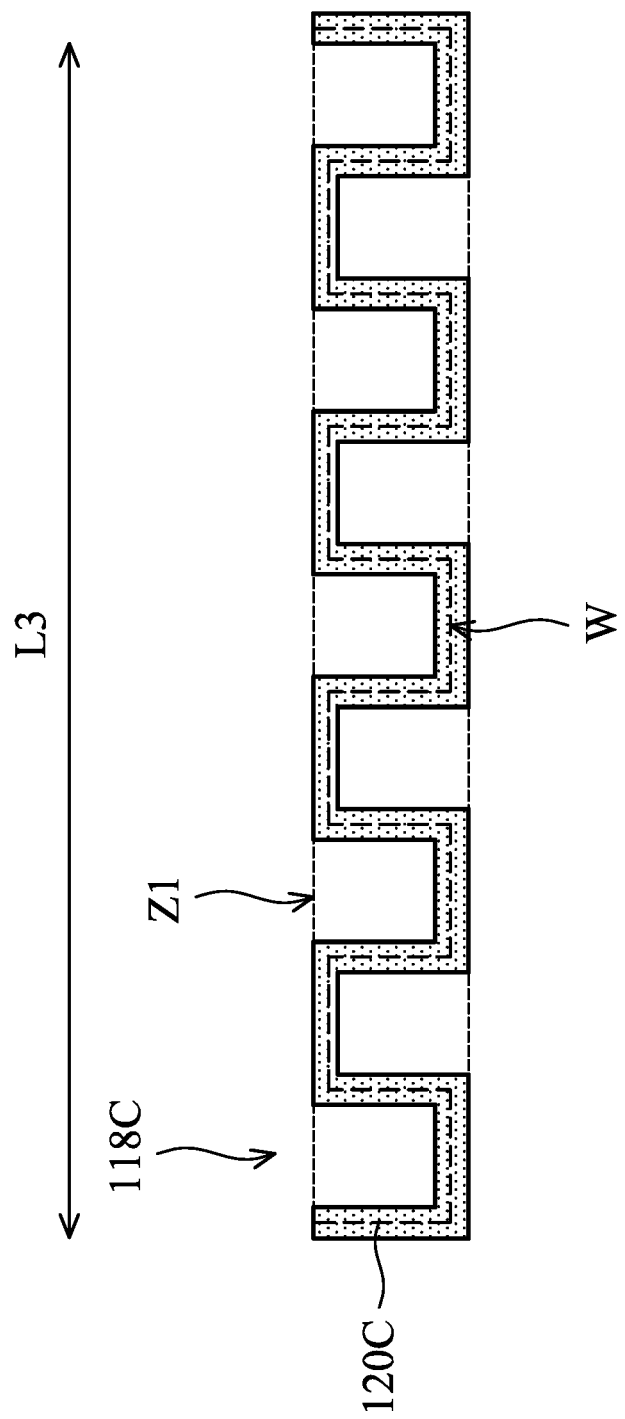

FIGS. 2A and 2B illustrate that each of the source electrode, the drain electrode, and the channel has a rectangular shape. Many variations and/or modifications can be made to embodiments of the disclosure. Refer to FIGS. 3A and 3B, which illustrate examples of the extending direction of the channel in accordance with some embodiments of the present disclosure. In some embodiments, as shown in FIG. 3A, the modulating unit 106C includes a transistor 108C and a modulating electrode 110C. The transistor 108C may have a source electrode 112C, a drain electrode 114C, a gate electrode 116C, a channel 118C and an semiconductor layer 120C. The channel 118C may be disposed between the source electrode 112C and the drain electrode 114C. The channels shown in the figures of the present disclosure are only for exemplary illustration and not intended to limit the scope of the present disclosure. The people having ordinary skill in the art should know the range of the channel region in practice. The details will not be described herein. The source electrode 112C and the drain electrode 114C respectively have multiple protruding portions 122 and 124 so that the channel 118C may have a bent shape.

In this embodiment, the extending direction of the channel 118C may be defined by two reference points located on the source electrode 112C and the drain electrode 114C, respectively. These two reference points can be chosen arbitrarily from the source electrode 112C and the drain electrode 114C overlapping the channel 118C. For example, the direction V5, which may be determined by a reference point K on the source electrode 112C and a reference point L on the drain electrode 114C, can be defined as an extending direction of the channel 118C. In other embodiments, the direction V6, which may be determined by a reference point K on the source electrode 112C and a reference point M on the drain electrode 114C, can also be chosen to define an extending direction of the channel 118C. The positions of the reference points used to define the extending direction of one transistor are the same as or corresponding to those of another transistor. In some examples, the extending directions of the channels in the transistors of at least two of the modulating units may be substantially parallel. More specifically, the included angles between the extending direction of the transistor and the longitudinal direction of the modulating electrode may vary in accordance with the longitudinal direction of the respective modulating electrodes.

Many variations and/or modifications can be made to embodiments of the disclosure. In some embodiments, the extending direction of the transistor may be defined in other ways. As shown in FIG. 3B, there is the smallest imaginary rectangle Z1 that can encircle the channel 118C. In this embodiment, the extending direction of the channel 118C may be referred to the extending direction of the imaginary rectangle Z1, such as the direction of the long side of the imaginary rectangle Z1.

In addition, as shown in FIG. 3B, the width-to-length ratio of the channel 118C may be defined as the ratio of the width W of the channel 118C to the length L3. The width W of the channel 118C may be the total length of the channel 118C. The length L3 may be the length of the long side of the imaginary rectangle Z1.

Figure 4B:
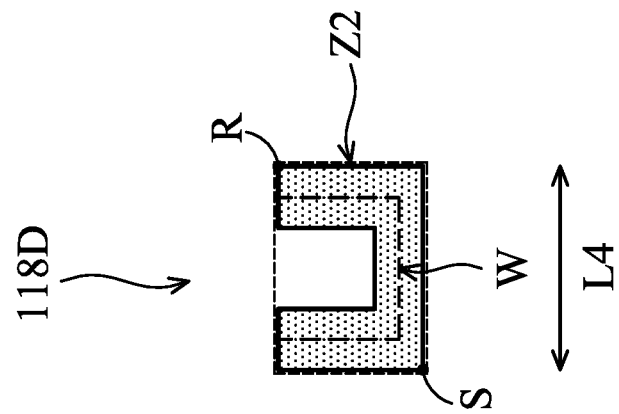
FIGS. 4A and 4B illustrate examples of the definition of the extending direction of the channel in the electronic modulating device in accordance with some embodiments of the present disclosure.
Figure 4A:
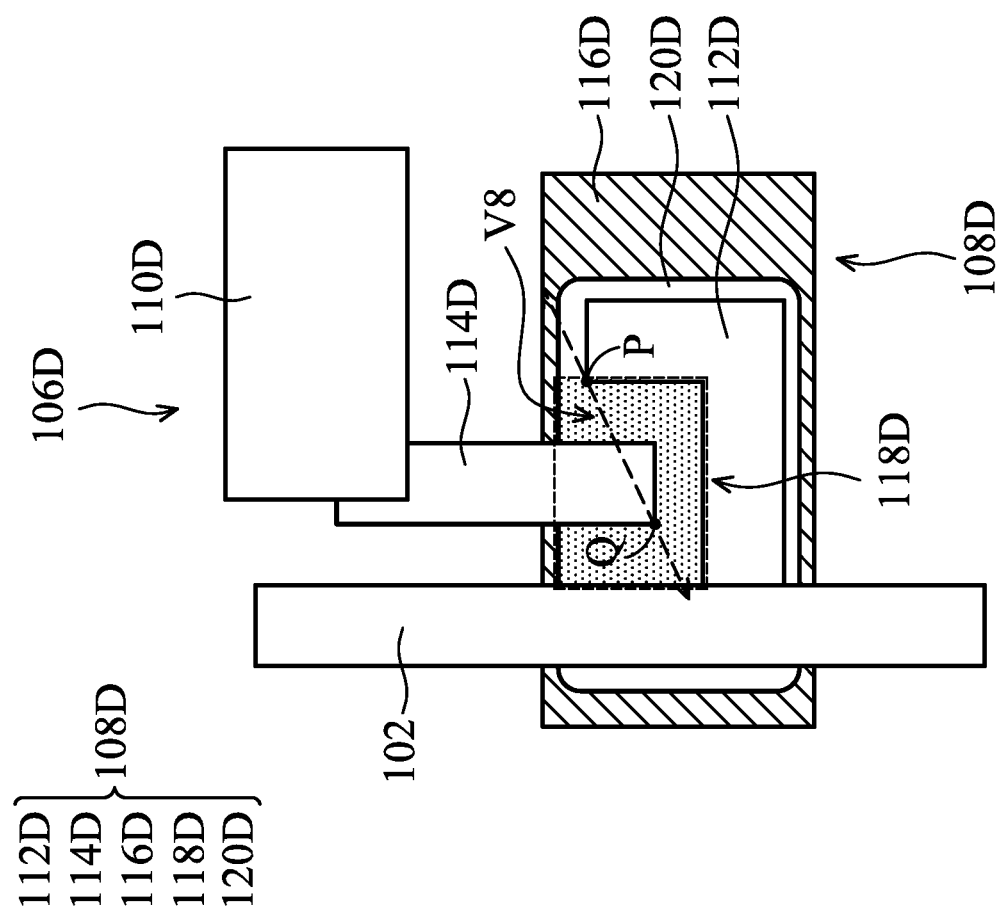

Many variations and/or modifications can be made to embodiments of the disclosure. In some embodiments, the source electrode and the drain electrode may have different shapes. Refer to FIGS. 4A and 4B, which illustrate examples of the definition of the extending direction of the channel in accordance with some embodiments of the present disclosure. As shown in FIGS. 4A and 4B, a modulating unit 106D includes a transistor 108D and a modulating electrode 110D. The transistor 108D may include a source electrode 112D, a drain electrode 114D, a gate electrode 116D, a channel 118D and a semiconductor layer 120D that is disposed between the source electrode 112D and the gate electrode 116D. The shapes of the source electrode 112D and the drain electrode 114D are different from the shapes of the source electrode 112C and the drain electrode 114C of FIG. 3A. Moreover, the channel 118D has a width-to-length ratio different from the channel 118C.

In this embodiment, the extending direction of the channel 118D may be defined by two reference points located on the source electrode 112D and the drain electrode 114D, respectively. The gate electrode 116D and the semiconductor layer 120D forms an overlapping region. These two reference points can be chosen arbitrarily from the source electrode 112D and the drain electrode 114D in the overlapping region. For example, the direction V8, which may be determined by a reference point P on the source electrode 112D and a reference point Q on the drain electrode 114D, may be regarded as the extending direction of the channel 118D.

Many variations and/or modifications can be made to embodiments of the disclosure. In some embodiments, the extending direction of the transistor may be defined in other ways. As shown in FIG. 4B, there is the smallest imaginary rectangle Z2 that can encircle the channel 118D. In this embodiment, the extending direction of the channel 118D may be referred to the extending direction of the imaginary rectangle Z2, such as the direction of the long side of the imaginary rectangle Z2. The width-to-length ratio of the channel 118D may be defined as the ratio of the width W of the channel 118D to the length L4. The width W of the channel 118D may be the total length of the channel 118D. The length L3 may be the length of the long side of the imaginary rectangle Z2.

Figure 5B:
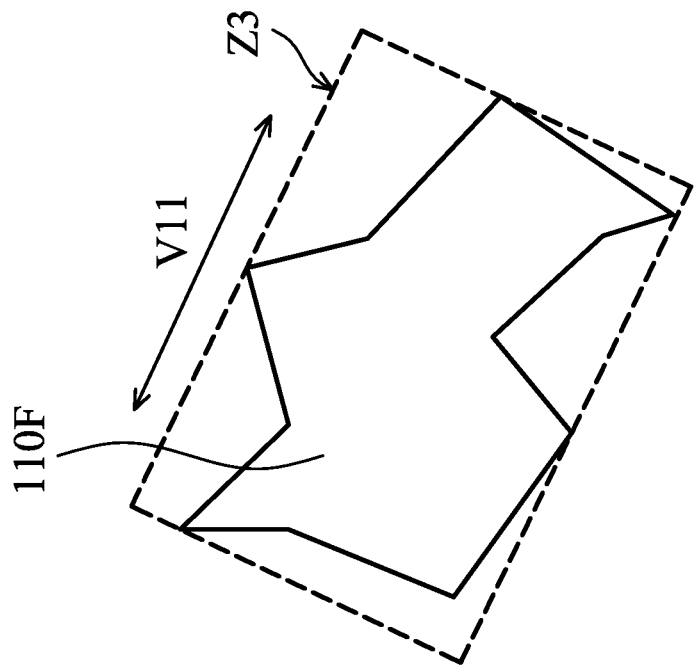
FIGS. 5A and 5B illustrate examples of the definition of the longitudinal direction of a modulating electrode in the electronic modulating device in accordance with some embodiments of the present disclosure.
Figure 5A:
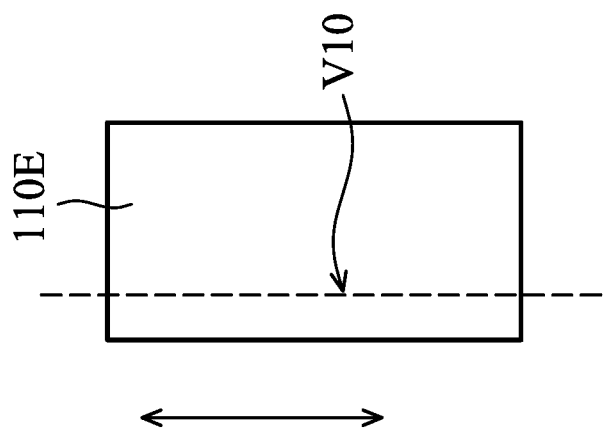

Refer to FIGS. 5A and 5B, which illustrate examples of the definition of the longitudinal direction of modulating electrodes in accordance with some embodiments of the present disclosure. In some embodiments, as shown in FIG. 5A, the modulating electrode 110E has a rectangular shape. In this embodiment, the direction V10, which may be parallel to the long side of the modulating electrode 110E, may be defined as a longitudinal direction of the modulating electrode 110E. In some embodiments, the modulating electrode 110F may have an irregular shape. FIG. 5B illustrates the smallest imaginary rectangle Z3 that can encircle the modulating electrode 110F. In this embodiment, direction V11, which may be parallel to the long side of the imaginary rectangle Z3, can be regarded as the longitudinal direction of the modulating electrode 110F. The smallest imaginary rectangle mentioned above can be obtained by software such as OpenCV or other suitable software.

Figure 6:
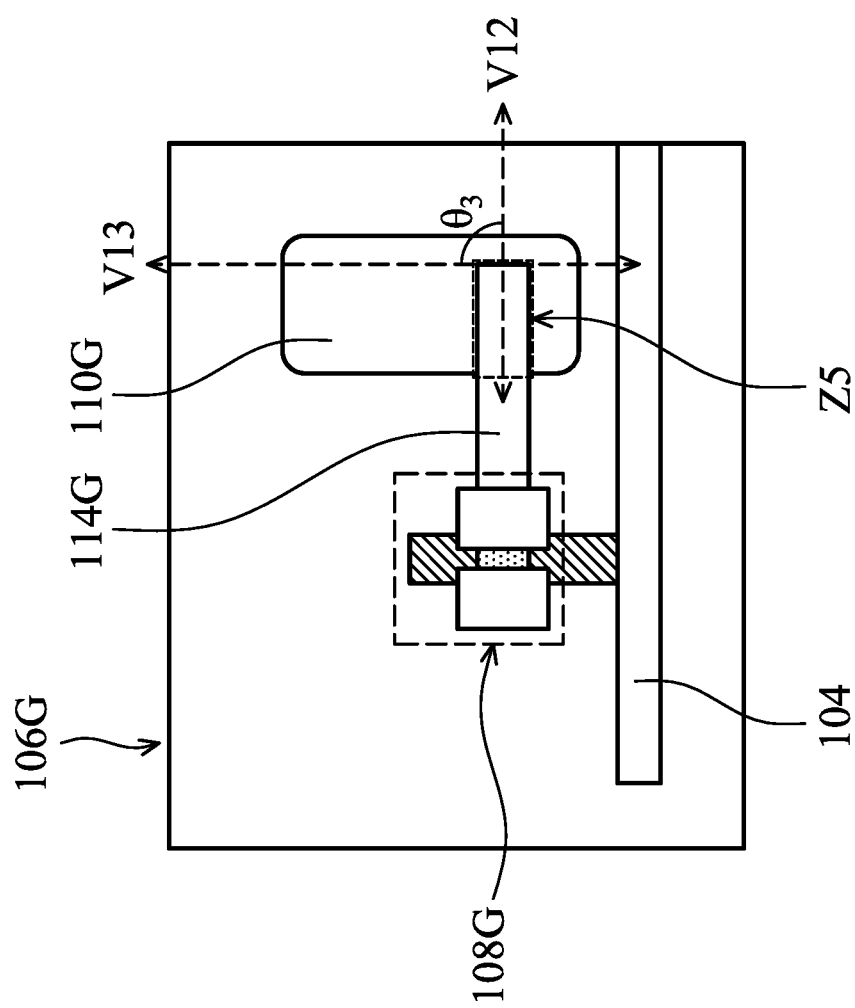
FIG. 6 illustrates enlarged top views of the modulating unit in the electronic modulating device in accordance with some embodiments of the present disclosure.

Refer to FIG. 6, which illustrates an enlarged top view of the modulating unit in the electronic modulating device in accordance with some embodiments of the present disclosure. As shown in FIG. 6, a modulating unit 106G includes transistor 108G and a modulating electrode 110G. The transistor 108G includes a drain electrode 114G electrically connected to the modulating electrode 110G. The drain electrode 114G and the modulating electrode 110G form an overlapping region Z5. In some embodiments, a ratio of the area of the overlapping region Z5 to the area of the modulating electrode 110G may be in a range from 5% to 50%, such as 15% or 35%. In some embodiments, the ratio of the area of the overlapping region Z5 to the area of the modulating electrode 110G may be in a range from 5% to 20%. If the ratio of the area of the overlapping region Z5 to the area of the modulating electrode 110G is in a range from 5% to 50%, the charging speed of the modulating electrode may be improved.

As shown in FIG. 6, there is a third included angle $\theta_3$ between the longitudinal direction of the overlapping region Z5 and the longitudinal direction of the modulating electrode 110G. As shown in FIG. 6, the direction V12 can be regarded as the longitudinal direction of the overlapping region Z5, and the direction V13 can be regarded as the longitudinal direction of the modulating electrode 110G. In this embodiment, the third included angle $\theta_3$ between the longitudinal direction of the overlapping region Z5 and the longitudinal direction of the modulating electrode 110G may be 90 degrees. Many variations and/or modifications can be made to embodiments of the disclosure. In some embodiments, a third included angle $\theta_3$ between the longitudinal direction of the overlapping region Z5 and the longitudinal direction of the modulating electrode 110G may range from 70 degrees to 110 degrees, such as 80 degrees, 90 degrees, or 100 degrees.

Figure 7B:
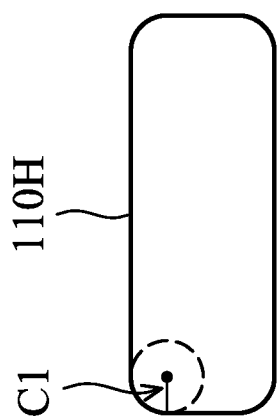
FIGS. 7A and 7B illustrate examples of the modulating electrodes in the electronic modulating device in accordance with some embodiments of the present disclosure.
Figure 7A:
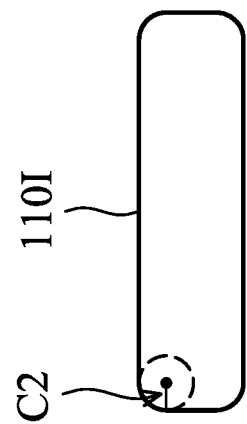

Refer to FIGS. 7A and 7B, which illustrate examples of the modulating electrodes in the electronic modulating device in accordance with some embodiments of the present disclosure. As shown in FIGS. 7A and 7B, a modulating electrode 110H and a modulating electrode 110I of the electronic modulating device may have different areas and shapes. In some embodiments, the profile of the modulating electrode 110H and modulating electrode 110I may have rounded corners. The rounded corner may assist in decreasing the aggregation of electrons at a sharp point. As a result, electrostatic discharge (ESD) can be reduced.

As shown in FIGS. 7A and 7B, since the area of the modulating electrode 110H may be different from the area of the modulating electrode 110I, the radius of curvature C1 of the corners of the modulating electrode 110H may be different from the radius of curvature C2 of the corners of the modulating electrode 110H. In some embodiments where the area of the modulating electrode 110H may be greater than that of the modulating electrode 110I, the radius of curvature C1 may be greater than the radius of curvature C2.

Figure 8:
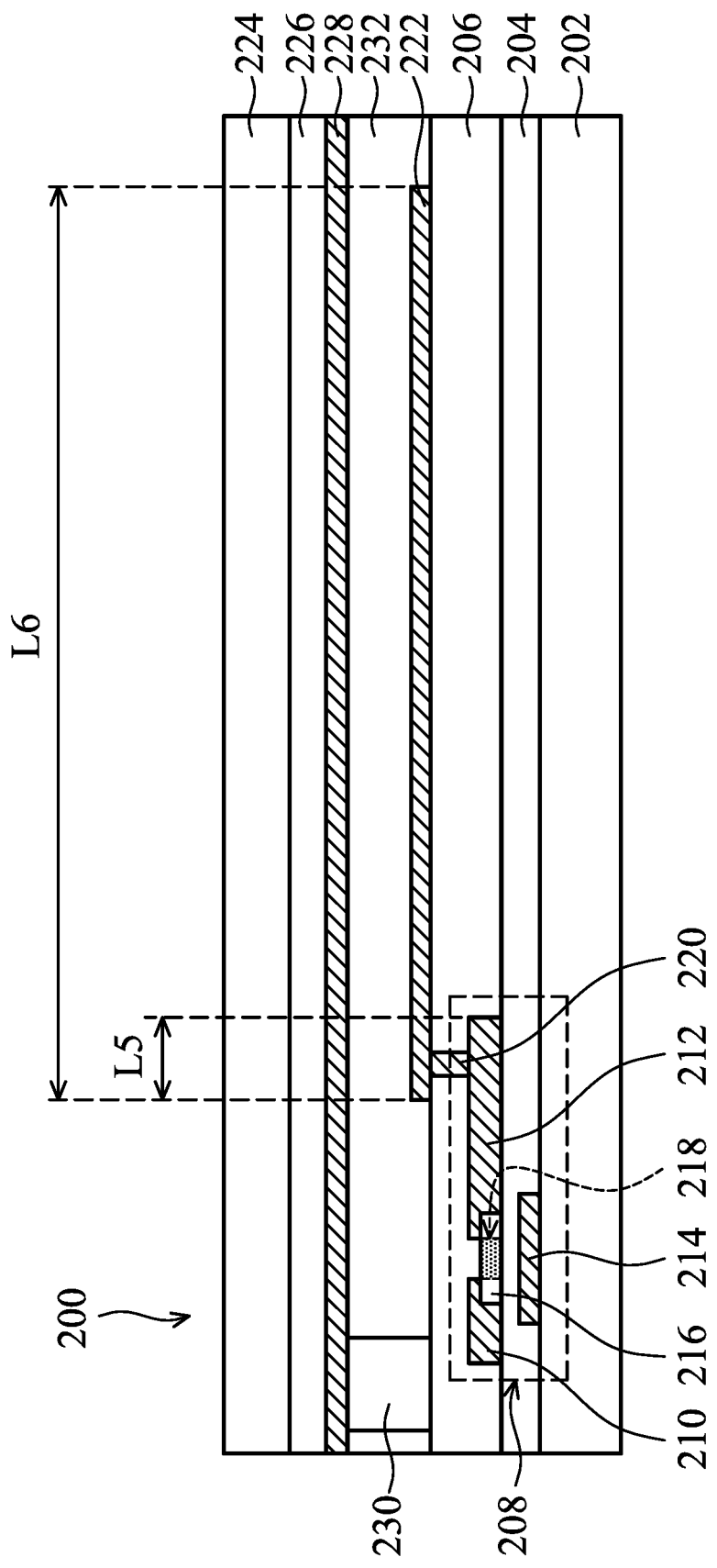
FIG. 8 illustrates a cross-sectional view of the electronic modulating device in accordance with some embodiments of the present disclosure.

Refer to FIG. 8, which illustrates a cross-sectional view of an electronic modulating device 200 in accordance with some embodiments of the present disclosure. It should be understood that some of the components of the electronic modulating device 200 are omitted in FIG. 8 for clarity. It also should be understood that additional components may be added to the electronic modulating device 200 in accordance with some embodiments of the present disclosure. Some of the components described below may be replaced or eliminated in accordance with some embodiments of the present disclosure.

As shown in FIG. 8, the electronic modulating device 200 includes a first substrate 202. The first substrate 202 may be used as the support for the transistor, modulating electrode and other components. The first substrate 202 may include a glass substrate, a ceramic substrate, a plastic substrate, and/or other applicable substrates. A gate insulator layer 204 and a passivation layer 206 are formed on the first substrate 202. The gate insulator layer 204 may include, but is not limited to, silicon dioxide or high dielectric constant (high-k) material, phosphosilicate glass (PSG), borophosphosilicate glass (BPSG), low dielectric constant (low-k) dielectric material and other applicable dielectric materials. The low dielectric constant dielectric materials include, but are not limited to, fluorinated silica glass (FSG), carbon doped silicon oxide, amorphous fluorinated carbon, parylene, bis-benzocyclobutenes (BCB), polyimides, combinations of the above-mentioned materials, and other applicable materials. The gate insulator layer 204 and the passivation layer 206 may be formed by a deposition process such as chemical vapor deposition, physical vapor deposition or other suitable deposition process.

In addition, the electronic modulating device 200 includes a transistor 208 that is formed on the first substrate 202. As shown in FIG. 8, the transistor 208 includes a source electrode 210, a drain electrode 212, a gate electrode 214, and a semiconductor layer 216. The gate electrode 214 may be disposed on the first substrate 202. The gate electrode 214 may include metal materials. For example, the gate electrode 214 may include, but is not limited to, copper (Cu), aluminum (Al), molybdenum (Mo), tungsten (W), gold (Au), chromium (Cr), nickel (Ni), platinum (Pt), titanium (Ti). The gate electrode 214 may be formed by, but is not limited to, a sputter process. The semiconductor layer 216 may be disposed on the gate insulator layer 204. The material of the semiconductor layer 216 may include, but is not limited to, amorphous silicon, polysilicon such as low-temp polysilicon (LTPS), metal oxide or other suitable materials. The metal oxide may include indium gallium zinc oxide (IGZO), indium zinc oxide (IZO), indium gallium zinc tin oxide (IGZTO). The source electrode 210 and the drain electrode 212 may be formed on the gate insulator layer 204. In addition, the source electrode 210 and the drain electrode 212 may be disposed on the gate electrode 214 and on two sides of the gate electrode 214. Moreover, portions of the source electrode 210 and the drain electrode 212 are formed on the semiconductor layer 216. The materials and formation methods of the source electrode 210 and the drain electrode 212 may be the same as or similar to those of the gate electrode 214. As shown in FIG. 8, the channel 218 may be formed in the gate insulator layer 204 and between the source electrode 210 and the drain electrode 212. It is noted that the structure of the transistor described herein is only for illustration, and it may use other suitable structures of the transistors, such as a top-gate transistor.

The gate insulator layer 204 illustrated in FIG. 8 may be disposed on the gate electrode 214. Many variations and/or modifications can be made to embodiments of the disclosure. In some embodiments, the gate electrode 214 may be formed on the passivation layer 206 and in the same horizontal layer as a modulating electrode 222. In some embodiments, the electronic modulating device 200 includes two gate electrodes where these two gate electrodes are located on the same horizontal layer. For example, these two gate electrodes may be formed on the first substrate 202. In some embodiments, the electronic modulating device 200 includes two gate electrodes where these two gate electrodes are disposed on different horizontal layers. For example, one of the gate electrodes is disposed on the first substrate 202, and one of the other is disposed on the passivation layer 206.

As shown in FIG. 8, the electronic modulating device 200 includes a conductive element 220 and a modulating electrode 222. The modulating electrode 222 may be electrically connected to the drain electrode 212 through the conductive element 220. The materials of the conductive element 220 and the modulating electrode 222 may be the same as or similar to the material of the gate electrode 214. In some embodiments, a lithography process and an etching process are performed on the passivation layer 206 to form an opening. Next, a metal material is filled into the opening and deposited on the passivation layer 206 followed by performing a lithography process and an etching process to pattern the metal material disposed on the passivation layer 206. As a result, the conductive element 220 and the modulating electrode 222 are formed. The photolithography process includes, but is not limited to, photoresist coating (e.g., spin-on coating), soft baking, mask alignment, exposure, post-exposure baking, developing the photoresist, rinsing and drying (e.g., hard baking). The photolithography process may also be implemented or replaced by other proper processes, such as a maskless photolithography process, an electron-beam process, an ion-beam process, or a combination thereof. The etching process may include, but is not limited to, a dry etching process, a wet etching process, and/or a combination thereof.

As shown in FIG. 8, the electronic modulating device 200 includes a second substrate 224. The second substrate 224 may be configured to dispose a common electrode and/or other components. The second substrate 224 may include a glass substrate, a ceramic substrate, a plastic substrate and/or other applicable substrates. A display element layer 226 may be formed on the second substrate 224. The display element layer 226 may include, but is not limited to, a color filter layer, a light shielding layer, a passivation layer, and other applicable components or layers. In addition, a common electrode 228 may be formed on the second substrate 224. The material and formation method of the common electrode 228 may be the same as or similar to those of the gate electrode 214. FIG. 8 illustrates that the common electrode 228 may be non-patterned. Many variations and/or modifications can be made to embodiments of the disclosure. In some embodiments, the common electrode 228 may be patterned so that the common electrode 228 has discrete portions.

As shown in FIG. 8, the electronic modulating device 200 may further include a spacer 230 and a modulating medium layer 232. The modulating medium layer 232 may be disposed between the modulating electrode 222 and the common electrode 228. For example, the modulating medium layer 232 may include a liquid crystal layer or other suitable layers. The spacer 230 may be configured to determine the cell gap between the first substrate 202 and the second substrate 224. In some embodiments, the spacer 230 may include, but is not limited to, polyethylene terephthalate (PET), polyethylene (PE), polyethersulfone (PES), polycarbonate (PC), polymethylmethacrylate (PMMA), glass, any other suitable materials, or a combination thereof. The potential difference between the modulating electrode 222 and the common electrode 228 may determine the orientation of the modulating medium layer 232. The voltage of the modulating electrode 222 can be controlled by the transistor 208 so that the orientation of the modulating medium layer 232 varied in accordance with the voltage of the modulating electrode 222.

Moreover, the modulating medium layer 232 may be applied in different liquid-crystal mode in accordance with the structure of the electrode or orientation of the polyimide layer. In some embodiments, the material of the modulating medium layer 232 may be, but is not limited to, a nematic liquid crystal, a smectic liquid crystal, a cholesteric liquid crystal, a blue phase liquid crystal, or any other applicable liquid-crystal material.

As shown in FIG. 8, there is a length L5 of an overlapping portion between the drain electrode 212 and the modulating electrode 222, and the modulating electrode 222 has a length L6. In some embodiments, a ratio of the length L5 to the length L6 of the modulating electrode 222 may be in a range from 30% to 90%, such as 50% or 70%. If the ratio of the length L5 to the length L6 of the modulating electrode 222 is in a range from 30% to 90%, the resistance of the electronic modulating device 200 can be reduced. The length L5 and the length L6 may be measured along the longitudinal direction of the modulating electrode 222. However, the length L5 and the length L6 may be measured along other directions, and the scope of the disclosure is not intended to be limited.

Figure 9:
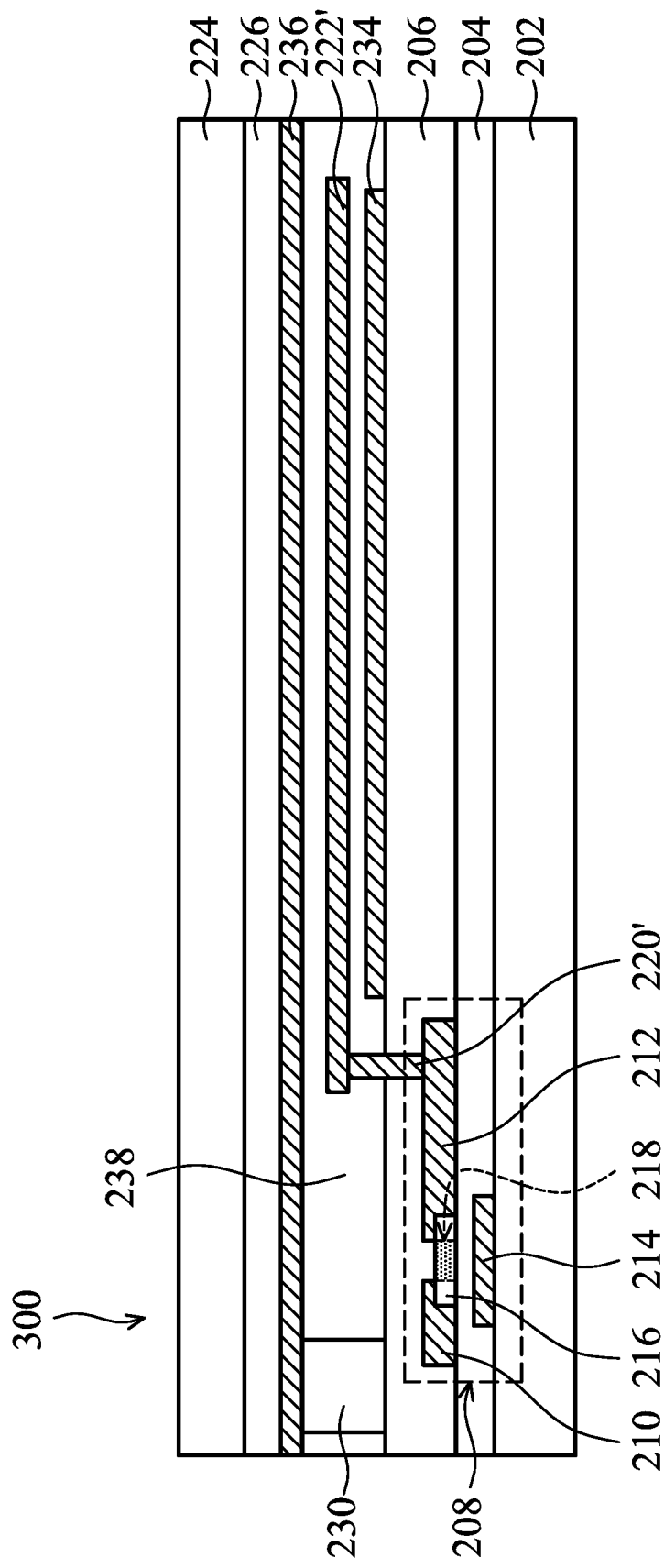
FIG. 9 illustrates a cross-sectional view of the electronic modulating device in accordance with some embodiments of the present disclosure.

Refer to FIG. 9, which illustrates a cross-sectional view of an electronic modulating device 300 in accordance with some embodiments of the present disclosure. As shown in FIG. 9, the electronic modulating device 300 includes a first electrode 234 disposed on the first substrate 202 and a second electrode 236 disposed on the second substrate 224. The modulating electrode 222' may be disposed between the first electrode 234 and the second electrode 236, and electrically connected to the drain electrode 212 through the conductive element 220'. The materials and the formation method of the conductive element 220', the modulating electrode 222', the first electrode 234 and the second electrode 236 are the same as or similar to those of the modulating electrode 222, and are not repeated herein. The first electrode 234 may be separated from the second electrode 236 by the spacer 230 and a cavity 238. The cavity 238 may include, but is not limited to, air or oil.

In some embodiments, the voltages of the first electrode 234 and the second electrode 236 may be fixed. The voltage of the modulating electrode 222' may be controlled by the transistor 208. When the voltage of the modulating electrode 222' changes, the modulating electrode 222' may shift correspondingly. When the position of the modulating electrode 222' changes, the capacitance between the second electrode 236 and the modulating electrode 222', or the capacitance between the first electrode 234 and the modulating electrode 222' may vary correspondingly. Therefore, the electro-magnetic radiation (e.g. the light) having a different wavelength can be emitted from and/or received by the electronic modulating device 300.

Figure 10:
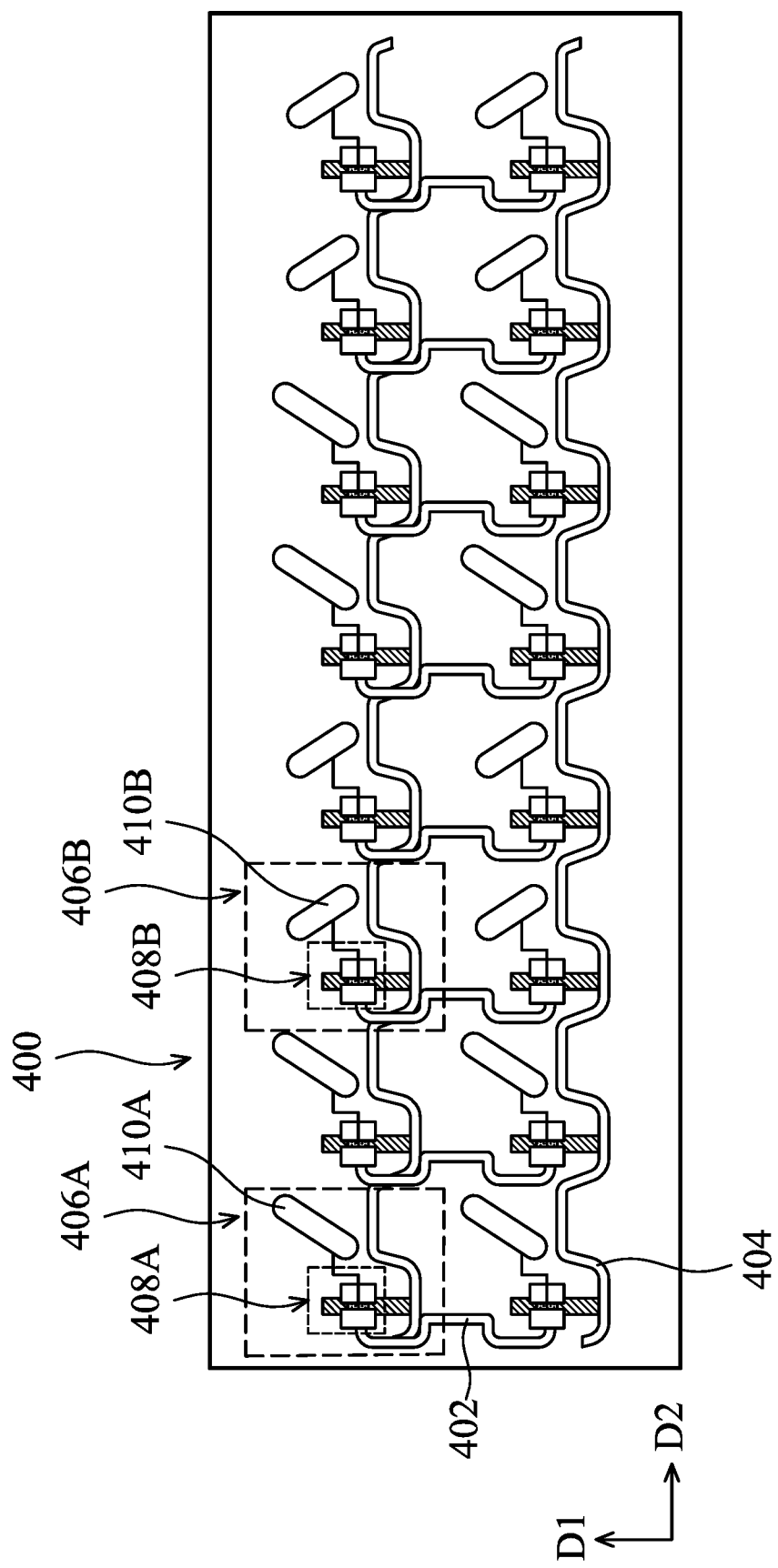
FIG. 10 illustrates a top view of the electronic modulating device in accordance with some embodiments of the present disclosure.

Refer to FIG. 10, which illustrates a top view of the electronic modulating device 400 in accordance with some embodiments of the present disclosure. As shown in FIG. 10, the electronic modulating device 400 includes a plurality of data lines 402 and scan lines 404. At least one of the data lines 402 may extend along the first direction D1, and at least one of the scan lines 404 may extend along the second direction D2 different from the first direction D1. The electronic modulating device 400 also includes a modulating unit 406A and a modulating unit 406B. The modulating unit 406A includes a transistor 408A and a modulating electrode 410A. The modulating unit 406B includes a transistor 408B and a modulating electrode 410B. In some embodiments, the area of the modulating electrode 410A may be different from that of the modulating electrode 410B. Moreover, the radius of the curvature at the corner of the modulating electrode 410A may be different from the radius of the modulating electrode 410B. Furthermore, the longitudinal direction of the modulating electrode 410A may be different from longitudinal direction of the modulating electrode 410B. As a result, the included angle between the extending direction of the channel in the transistor 408A and the longitudinal direction of the modulating electrode 410A may be different from the included angle between the extending direction of the channel in the transistor 408B and the longitudinal direction of the modulating electrode 410B. The arrangement of the modulating unit 406A and the modulating unit 406B shown in FIG. 10 may be modified. For example, the arrangement of the modulating unit 406A and the modulating unit 406B may be the same as that shown in FIG. 1, and the scope of the disclosure is not intended to be limited. In some embodiments, the size of the modulating electrode 410A of the modulating unit 406A may be different from the size of the modulating electrode 410B and the modulating unit 406B. In some examples, different sizes of the modulating electrodes may correspond to different width-to-length ratios of the channels. But the present disclosure is not limited thereto.

In some embodiments, at least one of the data lines 402 and at least one of the scan lines 404 may have wave shapes. Therefore, the electronic modulating device 400 may be applied in bending electronic device. Moreover, the included angles between different channels of the transistors (such as the modulating unit 406A and the modulating unit 406B) and the data line 402 (or scan line 404) may be substantially the same.

Refer to FIGS. 11A-11D, which illustrate top views of the electronic modulating devices in accordance with some embodiments of the present disclosure. FIGS. 11A-11D illustrate the different arrangements of the transistors and the modulating electrodes. However, the scope of the disclosure is not intended to be limited.

Figure 11A:
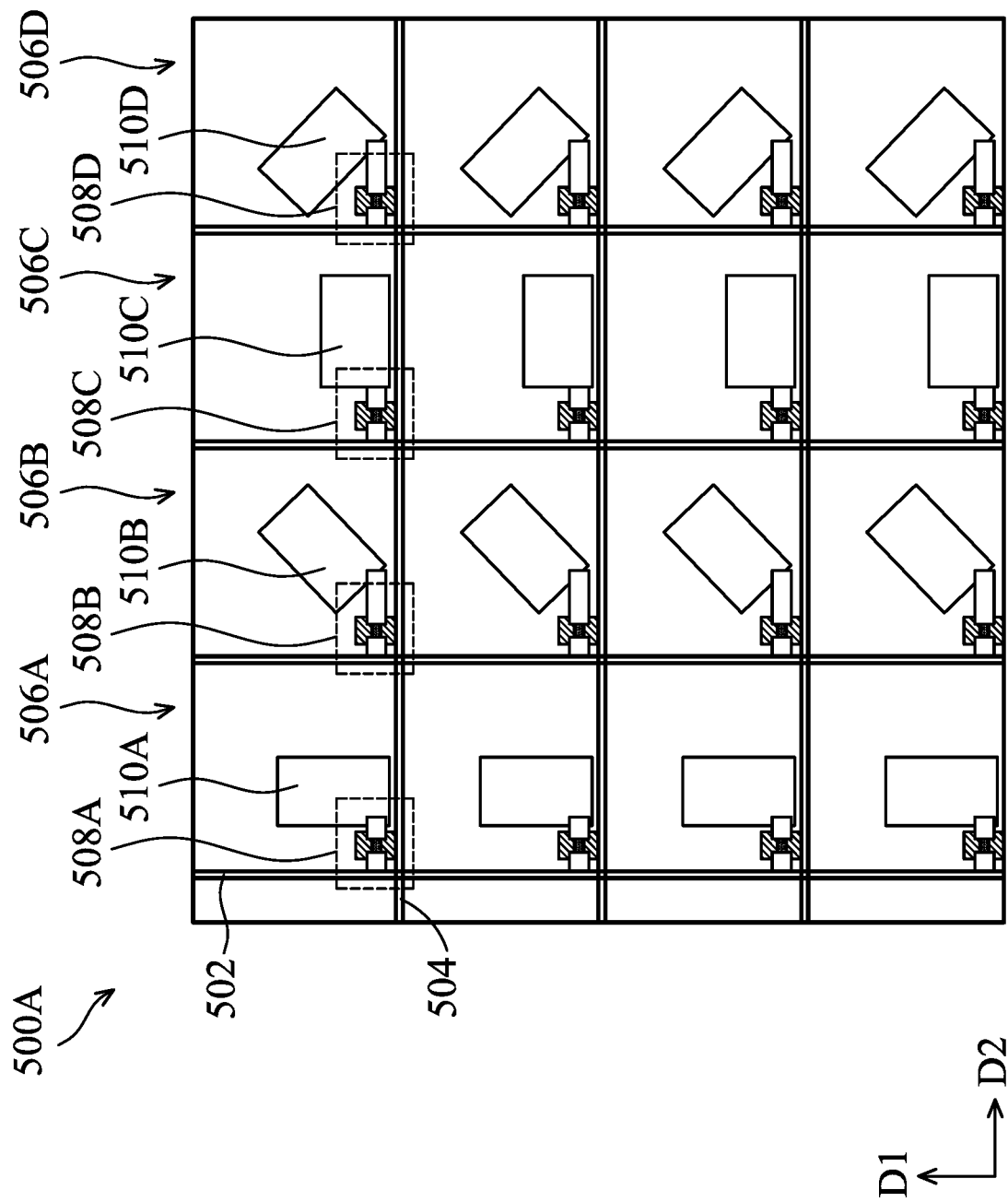
FIGS. 11A-11D illustrates a top view of the electronic modulating device in accordance with some embodiments of the present disclosure.

As shown in FIG. 11A, the electronic modulating device 500A includes modulating units 506A, 506B, 506C and 506D. The transistors modulating units 506A, 506B, 506C and 506D respectively include one transistor 508A, 508B, 508C and 508D and one modulating electrode 510A, 510B, 510C and 510D. As shown in FIG. 11A, the extending directions of the channels of the transistors 508A, 508B, 508C and 508D may be substantially parallel to each other. In addition, the longitudinal directions of the modulating electrodes 510A, 510B, 510C and 510D may be different from each other. As a result, the included angles between the extending direction of the channels of the transistors and the longitudinal directions of the modulating electrodes of the modulating units 506A, 506B, 506C and 506D may be different from each other. In some embodiments, some of the modulating units 506A, 506B, 506C and 506D may be arranged along the first direction D1. Many variations and/or modifications can be made to embodiments of the disclosure. In some embodiments, some of the modulating units 506A, 506B, 506C and 506D may be arranged along the second direction D2.

Figure 11B:
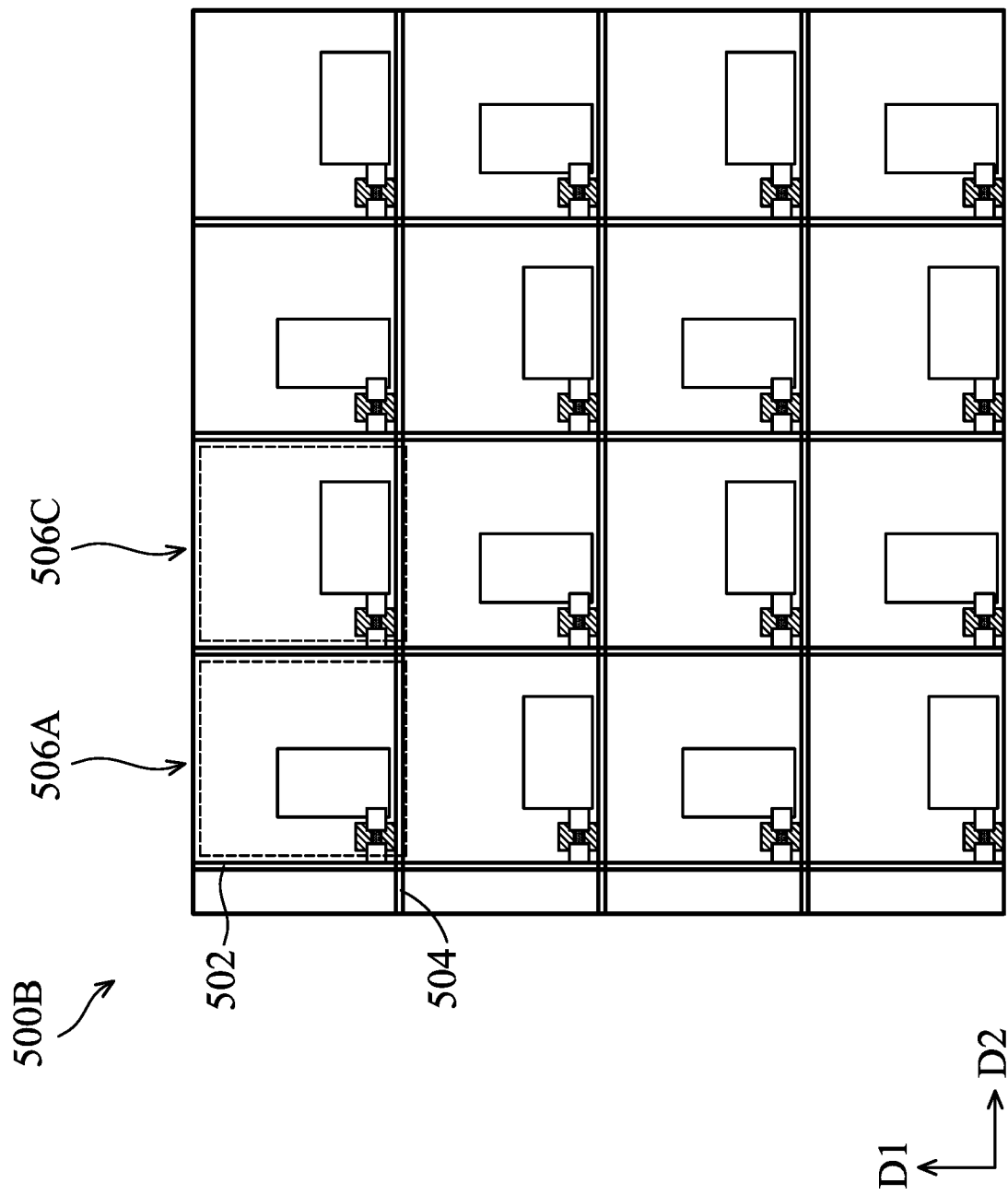

As shown in FIG. 11B, the electronic modulating device 500B includes a plurality of modulating units 506A and modulating units 506C. In some embodiments, the modulating units 506A and the modulating units 506C are alternately arranged along the second direction D2. In addition, the modulating unit 506A and the modulating unit 506C are alternately arranged along the first direction D1.

Figure 11C:
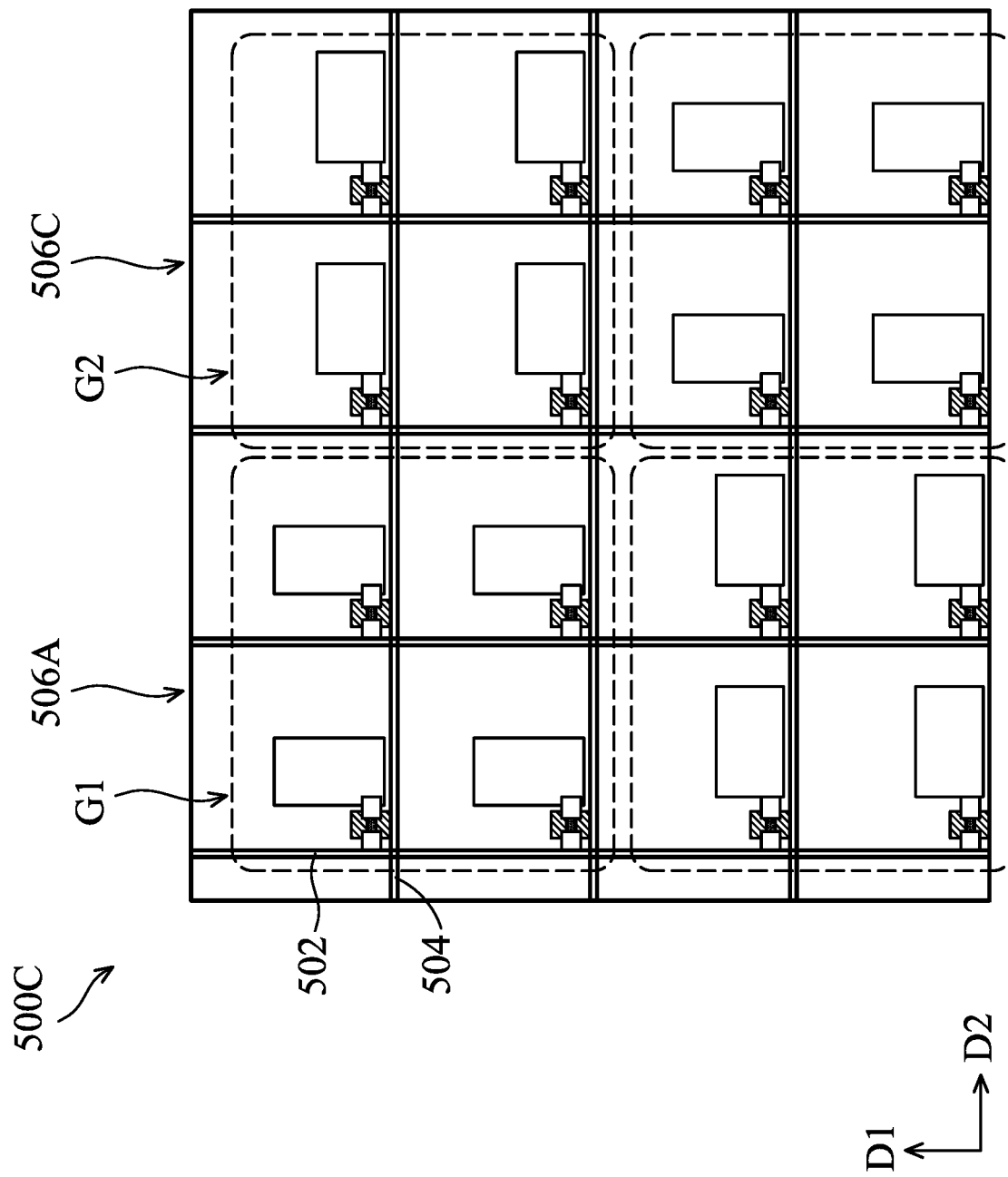

As shown in FIG. 11C, the electronic modulating device 500C includes the plurality of modulating units 506A and the modulating units 506C. In some embodiments, the four modulating units 506A can be classified to a group G1 which is a 2×2 array, and the four modulating units 506C can be classified to a group G2 which is a 2×2 array. The group G1 and the group G2 may be alternately arranged along the second direction D2. In addition, the group G1 and the group G2 may be alternately arranged along the first direction D1. Many variations and/or modifications can be made to embodiments of the disclosure. In some embodiments, the groups G1 and/or G2 may be an m×m array, wherein m is greater than 2. In some embodiments, the groups G1 and/or G2 may be an m×n array, wherein m and n are greater than or equivalent to 2, m and n are positive integers, and m≠n. Furthermore, the group G1 and/or the group G2 may be an oblique square m×m array.

Figure 11D:
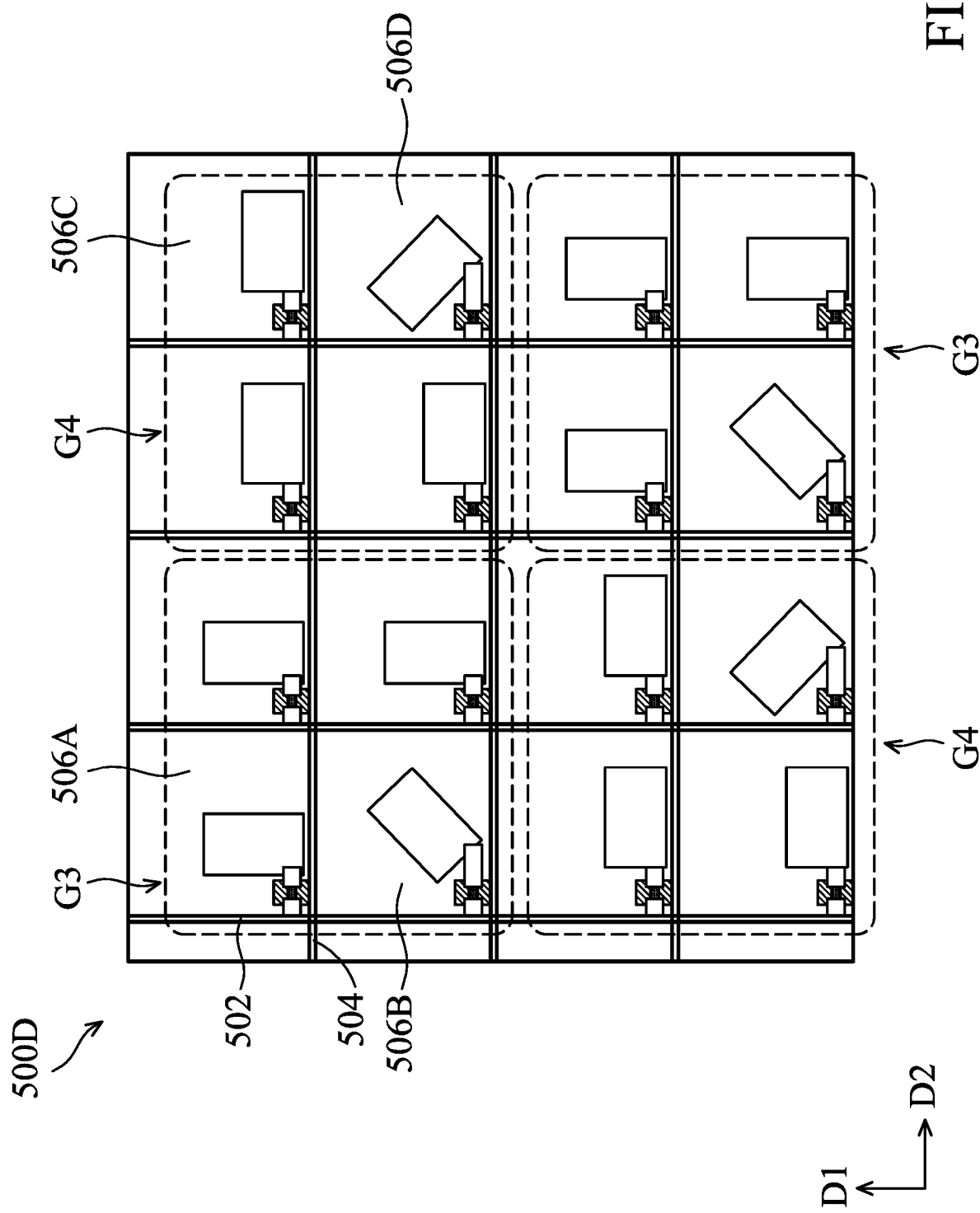

As shown in FIG. 11D, the electronic modulating device 500D includes the plurality of groups G3 and groups G4 that are 2×2 arrays. The group G3 and the group G4 may be alternately arranged along the second direction D2 and the first direction D1. Moreover, the group G3 may consist of three modulating unit 506A and one modulating unit 506B. The group G4 may consist of three modulating unit 506C and one modulating unit 506D. However, the scope of the disclosure is not intended to be limited.

Many variations and/or modifications can be made to embodiments of the disclosure. For example, the electronic modulating device may include a different arrangement for the electronic units. In addition, the area of the modulating electrodes may be altered. Furthermore, the width-to-length ratio of the channel of the transistor may be fine-tuned in accordance with the area of the modulating electrodes.

To summarize the above, the present disclosure provides an electronic modulating device. The electronic modulating device has electronic units that have different included angles. The included angle may be between the extending direction of the channel of the transistor and the longitudinal direction of the modulating electrode. Thus, the information emitted by the electronic device may not be affected when the receiver is located in an undesired location. Furthermore, the electronic modulating device of the embodiments can be applied in the structure of microelectromechanical system (MEMS), antenna system, or display device, and the scope of the disclosure is not intended to be limited.

Although some embodiments of the present disclosure and their advantages have been described in detail, it should be understood that various changes, substitutions and alterations can be made herein without departing from the spirit and scope of the disclosure as defined by the appended claims.

What is claimed is:

1. An electronic modulating device, comprising:
    a first modulating unit comprising:
        a first transistor comprising a channel arranged in an extending direction; and
        a first modulating electrode electrically connected to the first transistor and arranged in a first longitudinal direction; and
    a second modulating unit comprising:
        a second transistor comprising a channel arranged in the extending direction; and
        a second modulating electrode electrically connected to the second transistor and arranged in a second longitudinal direction different from the first longitudinal direction;
    wherein a first included angle between the extending direction and the first longitudinal direction is different from a second included angle between the extending direction and the second longitudinal direction.

2. The electronic modulating device as claimed in claim 1, wherein a difference between the first included angle and the second included angle is in a range from 15 degrees to 90 degrees.

3. The electronic modulating device as claimed in claim 1, wherein an area of the first modulating electrode is different from an area of the second modulating electrode.

4. The electronic modulating device as claimed in claim 3, wherein a width-to-length ratio of the channel of the first transistor is different from a width-to-length ratio of the channel of the second transistor.

5. The electronic modulating device as claimed in claim 1, wherein a distance between the channel of the first transistor and the first modulating electrode is different from a distance between the channel of the second transistor and the second modulating electrode.

6. The electronic modulating device as claimed in claim 1, wherein the first transistor further comprises a first drain electrode electrically connected to the first modulating electrode, and the first drain electrode and the first modulating electrode form an overlapping region.

7. The electronic modulating device as claimed in claim 6, wherein the overlapping region has a third longitudinal direction, and a third included angle between the third longitudinal direction and the first longitudinal direction is in a range from 70 degrees to 110 degrees.

8. The electronic modulating device as claimed in claim 6, wherein a ratio of a length of the overlapping region to a length of the first modulating electrode along the longitudinal direction of the overlapping region is in a range from 30% to 90%.

9. The electronic modulating device as claimed in claim 6, wherein a ratio of an area of the overlapping region to an area of the first modulating electrode is in a range from 5% to 50%.

10. The electronic modulating device as claimed in claim 6, wherein the second transistor further comprises a second drain electrode electrically connected to the second modulating electrode, and a length of the first drain electrode is different from a length of the second drain electrode.

11. The electronic modulating device as claimed in claim 1, wherein the first modulating electrode has a first rounded corner, and the second modulating electrode has a second rounded corner.

12. The electronic modulating device as claimed in claim 11, wherein a radius of curvature of the first rounded corner is different from a radius of curvature of the second rounded corner.

13. The electronic modulating device as claimed in claim 1, further comprising:
- a scan line extending along a first direction, and electrically connected to at least one of the first transistor and the second transistor; and
- a data line extending along a second direction different from the first direction;
- wherein at least one of the scan line and the data line has a wavy shape.

14. The electronic modulating device as claimed in claim 1, further comprising a first common electrode and a modulating medium layer, a portion of the modulating medium layer is disposed between the first common electrode and the first modulating electrode.

15. The electronic modulating device as claimed in claim 1, wherein the first modulating unit further comprises a first electrode and a second electrode, and wherein the first electrode is disposed between the first modulating electrode and the first transistor, and the first modulating electrode is disposed between the first electrode and the second electrode.

16. An electronic modulating device, comprising:
a first modulating unit comprising:
- a first transistor comprising a channel; and
- a first modulating electrode electrically connected to the first transistor; and
a second modulating unit comprising:
- a second transistor comprising a channel; and
- a second modulating electrode electrically connected to the second transistor;
- wherein a distance between the channel of the first transistor and the first modulating electrode is different from a distance between the channel of the second transistor and the second modulating electrode.

17. The electronic modulating device as claimed in claim 16, wherein an area of the first modulating electrode is different from an area of the second modulating electrode.

18. The electronic modulating device as claimed in claim 16, wherein a width-to-length ratio of the channel of the first transistor is different from a width-to-length of the channel of the second transistor.

19. The electronic modulating device as claimed in claim 16, wherein the first transistor further comprises a first drain electrode electrically connected to the first modulating electrode, the second transistor further comprises a second drain electrode electrically connected to the second modulating electrode, and a length of the first drain electrode is different from a length of the second drain electrode.

20. The electronic modulating device as claimed in claim 19, wherein the first drain electrode and the first modulating electrode forms an overlapping region, and a ratio of an area of the overlapping region to an area of the first modulating electrode is in a range from 5% to 50%.

* * * * *